(12) United States Patent
Nishihara

(10) Patent No.: US 6,301,145 B1
(45) Date of Patent: Oct. 9, 2001

(54) FERROELECTRIC MEMORY AND METHOD FOR ACCESSING SAME

(75) Inventor: Toshiyuki Nishihara, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/587,253

(22) Filed: Jun. 2, 2000

(30) Foreign Application Priority Data

Jun. 4, 1999 (JP) .................................................. 11-158632

(51) Int. Cl.⁷ .................................................. G11C 11/22
(52) U.S. Cl. ........................ 365/145; 365/149; 257/295
(58) Field of Search ................................. 365/145, 149; 257/295, 296

(56) References Cited

U.S. PATENT DOCUMENTS 5,524,093 * 6/1996 Kuroda .................................. 365/145
5,936,832 * 8/1999 Saito et al. ............................ 365/149
6,137,711 * 10/2000 Tan ....................................... 365/145

* cited by examiner

Primary Examiner—Son Mai
(74) Attorney, Agent, or Firm—Ronald P. Kananen; Rader, Fishman & Grauer

(57) ABSTRACT

A ferroelectric memory capable of guaranteeing stable access without destruction of data while maintaining a very small cell size, and a method for accessing the same, which independently selects a first word line and a second word line in a first operation mode and simultaneously select them in a second operation mode and stores one bit in a pair of ferroelectric capacitors sharing their each plate lines as electrodes and, when reading it out, in the first operation mode, performs a read and rewrite operation continuously and together for all data stored in ferroelectric capacitors of a selected first cell string and then performs the read and the rewrite operation continuously and together for all data stored in the ferroelectric capacitors of a second cell string and, in the second operation mode, performs the read and rewrite operation continuously and together for all data stored in the ferroelectric capacitors of the first and second cell strings.

8 Claims, 7 Drawing Sheets

FERROELECTRIC MEMORY AND METHOD FOR ACCESSING SAME

BACKGROUND OF THE INVENTION

1. Field of the Invention

The present invention relates to a ferroelectric memory utilizing polarization inversion of ferroelectric substance and a method for accessing the same.

2. Description of the Related Art

Recently there has been active research into large capacity ferroelectric memories. A ferroelectric memory enables high speed access and is nonvolatile, so utilization for a main storage of a portable computer having a file storage and resume function and so on has been expected.

Initial attempts at using a ferroelectric capacitor to store data at a high density used a configuration called a simple matrix type which placed only a capacitor at an intersection of two orthogonal two drive lines (bit line and word line).

FIG. 1 is a circuit diagram of an example of the configuration of a simple matrix type ferroelectric memory.

This simple matrix type ferroelectric memory 1 is configured by a memory cell array 2 comprised of a plurality of (20 in FIG. 1) ferroelectric capacitors FC1 to FC20 arranged in the form of a 4×5 matrix, a row decoder 3, and a sense amplifier/column decoder 4.

In the memory cell array 1, one electrode each of the ferroelectric capacitors FC1 to FC5, FC6 to FC10, FC11 to FC15, and FC16 to FC20 arranged in the identical row are connected to identical word lines WL1, WL2, WL3, and WL4, the other electrodes of FC1, FC6, FC11, and FC16 arranged in the identical column are connected to a bit line BL1, the other electrodes of FC2, FC7, FC12, and FC17 are connected to a bit line BL2, the other electrodes of FC3, FC8, FC13, and FC18 are connected to a bit line BL3, the other electrodes of FC4, FC9, FC14, and FC19 are connected to a bit line BL4, and the other electrodes of FC5, FC10, FC15, and FC20 are connected to a bit line BL5.

Further, the word lines WL1 to WL4 are connected to the row decoder 3, and the bit lines BL1 to BL5 are connected to the sense amplifier/column decoder 4.

The ferroelectric capacitor has a hysteresis characteristic and stores and reads data by utilizing this hysteresis characteristic.

Below, an explanation will be made of the hysteresis characteristic of a ferroelectric capacitor In relation to FIGS. 2A to 2C.

FIG. 2A shows the hysteresis characteristic, while FIGS. 2B and 2C show states of the capacitor In which a first data (hereinafter referred to as a data "1") and a second data (hereinafter referred to as a data "0") having inverse phases to each other are written.

The ferroelectric memory is utilized as a nonvolatile memory by defining a state where a plus side voltage is supplied to a ferroelectric capacitor (C in FIG. 2A) and a residual polarization charge of +Qr remains (A in FIG. 2A) as the data "1" and defining a state where a minus side voltage is supplied (D in FIG. 2A) and a residual polarization charge of −Qr remains (B in FIG. 2A) as the data "0" in the hysteresis characteristic shown in FIG. 2A.

Namely in the ferroelectriert memory, the polarizati o n of the ferroelectric film is used for the storage of the data and an electric field is added between the two electrodes configuring the capacitor for reading the data.

Where the field is given in an opposite direction to the polarization, the polarization state direction as that for the polarization, so the data can be read by detecting that difference.

For example, when reading the stored data of a memory cell MC1 in FIG. 1, a predetermined potential difference is given between the bit line BL1 and the word line WL1. By this, the charge stored in the ferroelectric capacitor FC1 is released to the bit line BL1 and the released charge is detected by the sense amplifier of the sense amplifier/column decoder 4.

Summarizing the problem to be solved by the invention, in the case of this simple matrix type ferroelectric memory, since basically no transistor is required for a memory cell, an extremely small memory cell can be realized. In this configuration, however, there is the problem of disturbance as shown below.

For example, when writing the data "1" in the memory cell MC1 (ferroelectric capacitor FC1), 0V is supplied to the word line WL1, and a power supply voltage $V_{cc}$ is supplied to the bit line BL1.

At this time, the potentials of for example the nonselected word lines WL2 to WL4 are fixed at $V_{cc}/2$, but when for example the data "0" is written in the nonselected memory cell MC2 (ferroelectric capacitor FC6), the ferroelectric capacitor FC6 will receive a voltage of $V_{cc}/2$, i.e., a so-called disturbance, in the direction in which the data is destroyed.

Accordingly, in a simple matrix type ferroelectric memory, the data of the capacitor for which the nonselection state contin ues for a long t ime gradually deteriorates and finally ends up disappearing. For this reason, the retention of the data could not be guaranteed and this memory was not suited for practical use.

Contrary to this, in U.S. Pat. No. 4,873,664, S. Sheffield et al. solved this problem by arranging a path transistor between the bit line and the capacitor electrode.

As the method for realizing this, a ferroelectric memory employing a method of configuring one memory cell by one path transistor and one ferroelectric capacitor to store one bit (one-transistor+one-capacitor type cell) is shown in FIG. 3.

FIG. 3 is a circuit diagram of an example of the configuration of a folded bit line type ferroelectric memory having a one-transistor+one-capacitor type cell.

This ferroelectric memory 5 is configured by a memory cell array 6 comprising a plurality of (eight In FIG. 3) memory cells MC01 to MC08 arranged in the form of the matrix, a row decoder 7. a plate decoder 8, and sense amplifiers (S/A) 9-1 and 9-2.

Each memory cell MC01 (to MC08) is configured by one path transistor TR01 (to TR08) and one ferroelectric capacitor FC01 (to FC08).

Note that the path transistors TR01 to TR08 are configured by for example n-channel MOS transistors.

Further, one electrode each of the ferroelectric capacitors FC01 and FC03 configuring the memory cells MC01 and MC03 arranged in the identical column are connected via the path transistors TR01 and TR03 to a bit line BL01.

Similarly, one electrode each of the ferroelectric capacitors FC02 and FC04 configuring the memory cells MC02 and MC04 are connected via the path transistors TR02 and TR04 to a bit line BL03, one electrode each of the ferroelectric capacitors FC05 and FC07 configuring the memory cells MC05 and MC07 are connected via the path transistors TR05 and TR07 to a bit line BL02, and one electrode each of the ferroelectric capacitors FC06 and FC08 configuring the memory cells MC06 and MC08 are connected via the path transistors TR06 and TR08 to a bit line BL04.

Further, the other electrodes of the ferroelectric capacitors FC01 and FC02 configuring the memory cells MC01 and MC02 are connected to a common plate line PL01.

Similarly, the other electrodes of the ferroelectric capacitors FC03 to FC06 configuring the memory cells MC03 and MC06 are connected to a common plate line PL02, and the other electrodes of the ferroelectric capacitors FC07 and FC08 configuring the memory cells MC07 and MC08 are connected to a common plate line PL03.

The gate electrodes of the path transistors TR01 and TR02 configuring the memory cells MC01 and MC02 arranged in the identical row are connected to a common word line WL01.

Similarly, the gate electrodes of the path transistors TR03 and TR04 configuring the memory cells MC03 and MC04 arranged in the identical row are connected to a common word line WL02, the gate electrodes of the path transistors TR05 and TR06 configuring the memory cells MC05 and MC06 arranged in the identical row are connected to a common word line WL03, and the gate electrodes of the path transistors TR07 and TR08 configuring the memory cells MC07 and MC08 arranged in the identical row are connected to a common word line WL04.

A read and write operation of this one-transistor+one-capacitor type cell is carried out by supplying for example a power supply voltage $V_{cc}+\alpha$ ($\alpha$ is a voltage not less than a threshold voltage Vth of the path transistor, for example 1V) to the word line to which the selected memory cell is connected and holding the path transistor TR in a conductive state.

When writing data in for example the memory cell MC01, 0V is supplied to the bit line BL01, and the power supply voltage VCC+1V is supplied to the word line WL01.

By this, the path transistor TR01 becomes the conductive state, and 0V is supplied to one electrode of the ferroelectric capacitor FC01. At this time, the plate line PL01 is held at 0V.

Thereafter, the power supply voltage $V_{cc}$ is supplied to the plate line PL01, and then 0V is supplied to this. Namely, during the period during which the word line WL01 is held at the power supply voltage $V_{cc}$ level, a pulse of $0V \rightarrow V_{cc} \rightarrow 0V$ is supplied to the plate line PL01.

By this, polarization occurs at the ferroelectric capacitor FC01, a polarization state from the other electrode (plate line side) to one electrode (bit line side) is exhibited, and the writing is terminated.

Further, when reading the data of the memory cell MC01, 0V is supplied to the bit lines BL01 to BL04, then the lines are left open. Also, at this time, the power supply voltage $V_{cc}+1V$ is supplied to the word line WL01.

Next, when the potential of the plate line PL01 is raised from 0V to the power supply voltage $V_{cc}$ level, an amount of charge according to the polarization state of the ferroelectric substance is released to the bit lines BL01 and BL03.

For example, when the polarization state of the ferroelectric capacitor FC01 is the state from the other electrode (plate line side) to one electrode (bit line side), polarization is not inverted. On the other hand, when the polarization state of the ferroelectric capacitor FC01 is the state from one electrode (bit line side) to the other electrode (plate line side), the polarization is inverted.

When inverting the polarization, the movement of charge accompanying the change of the polarization is large compared when not inverting the polarization. Accordingly the potential V1 of the bit line BL01 in the case of inverting the polarization becomes larger than a potential V2 of the bit line BL01 when not inverting the polarization.

Data is read by latching this potential V1 or V2 of the bit line at a level according to its magnitude compared with a reference potential Vref (V1>Vref>V2) by for example a not illustrate dummy cell, that is, $V_{cc}$ or 0V in the sense amplifier.

Then, by finally supplying 0V to the plate line PL01 again, the polarization inverted ferroelectric capacitor is returned to the original polarization state.

By this, one read operation is completed.

In a ferroelectric memory employing this one-transistor+one-capacitor type cell, it is possible to reduce the frequency of disturbance to zero, but the memory uses one or more transistors for the storage of one bit of data, so there was the problem in that the cell area became large and a reduction of the chip size was difficult.

SUMMARY OF THE INVENTION

An object of the present Invention is to provide a ferroelectric memory capable of guaranteeing stable access without destruction of data while maintaining a very small cell size and a method for accessing this.

To attain the above object, according to a first aspect of the present invention, there is provided a ferroelectric memory provided with a first bit line, a second bit line, a first word line, a second word line, a plurality of plate lines, a first cell string having a first node electrode, a first path transistor connected between the first bit line and the first node electrode and held in a conductive state or a nonconductive state according to a voltage supplied to the first word line, and a plurality of ferroelectric capacitors with one electrodes commonly connected to the first node electrode and the other electrodes connected to plate lines different from each other, and a second cell string having a second node electrode, a second path transistor connected between the second bit line and the second node electrode and held in the conductive state or the nonconductive state according to the voltage supplied to the second word line, and a plurality of ferroelectric capacitors with one electrodes commonly connected to the second node electrode and the other electrodes connected to plate lines different from each other.

Further, preferably the memory is further provided with a means for independently selecting the first word line and second word line, making them hold the first path transistor and second path transistor independently in the conductive state or the nonconductive state, and capable of independently accessing the plurality of ferroelectric capacitors of the cell string where the path transistor is in the conductive state.

Further, preferably the memory is further provided with a means for giving a reference potential to the second bit line when the first word line is selected and giving the reference potential to the first bit line when the second word line is selected.

Further, preferably the memory is further provided with a means for performing a read and rewrite operation continuously and together for all data stored in the ferroelectric capacitors of the first cell string and then selecting the second word line and performing the read and the rewrite operation continuously and together for all data stored in the ferroelectric capacitors of the second cell string when the first word line is selected at the time of reading data and for performing a read and rewrite operation continuously and together for all data stored in the ferroelectric capacitors of the second cell string and then selecting the first word line and performing the read and the rewrite operation continuously and together for all data stored in the ferroelectric capacitors of the first string when the second word line is selected at the time of reading data.

Further, the memory preferably is further provided with a means for simultaneously selecting the first word line and second word line, making them hold the first path transistor and second path transistor in a conductive state in parallel, and storing one bit in a pair of ferroelectric capacitors in the first and second cell strings sharing a plate line as electrodes.

Further, the memory preferably is further provided with a means for performing the read and the rewrite operation continuously and together for all data stored in the ferroelectric capacitor pairs of the first and second cell strings when the first and second word lines are selected at the time of reading data.

Further, preferably each ferroeleotric capacitor is formed in an upper layer of the bit line.

According to a second aspect of the present invention, there is provided a ferroelectric memory, capable of operating in a first operation mode and a second operation mode, provided with a first bit line, a second bit line, a first word line, a second word line, a plurality of plate lines, a first cell string having a first node electrode, a first path transistor connected between the first bit line and the first node electrode and held in a conductive state or a nonconductive state according to a voltage supplied to the first word line, and a plurality of ferroelectric capacitors with one electrodes commonly connected to the first node electrode and the other electrodes connected to plate lines different from each other, a second cell string having a second node electrode, a second path transistor connected between the second bit line and the second node electrode and held in the conductive state or the nonconductive state according to the voltage supplied to the second word line, and a plurality of ferroelectric capacitors with one electrodes commonly connected to the second node electrode and the other electrodes connected to plate lines different from each other, and a mode means for independently selecting the first word line and second word line in the first operation mode, making them hold the first path transistor and second path transistor independently in the conductive state or the nonconductive state, independently accessing each of the plurality of ferroelectric capacitors of the cell string where the path transistor is in the conductive state to store one bit in one ferroelectric capacitor, while simultaneously selecting the first word line and second word line in the second operation mode, making them hold the first path transistor and second path transistor in the conductive state in parallel, and storing one bit in a pair of ferroelectric capacitors in the first and second cell strings having each plate line as the electrode.

According to a third aspect of the present invention, there is provided a method for accessing a ferroelectric memory having a first bit line, a second bit line, a first word line, a second word line, a plurality of plate lines, a first cell string having a first node electrode, a first path transistor connected between the first bit line and the first node electrode and held in a conductive state or a nonconductive state according to a voltage supplied to the first word line, and a plurality of ferroelectric capacitors with one electrodes commonly connected to the first node electrode and the other electrodes connected to plate lines different from each other, and a second cell string having a second node electrode, a second path transistor connected between the second bit line and the second node electrode and held in the conductive state or the nonconductive state according to the voltage supplied to the second word line, and a plurality of ferroelectric capacitors with one electrodes commonly connected to the second node electrode, and the other electrodes connected to plate lines different from each other, comprising steps of independently selecting the first word line and second word line, performing the read and the rewrite operation continuously and together for all data stored in the ferroelectric capacitors of the first cell string and then selecting the second word line, and performing the read and the rewrite operation continuously and together for all data stored in the ferroelectric capacitors of the second cell string when the first word line is selected at the time of reading data and performing the read and the rewrite operation continuously and together for all data stored in the ferroelectrio capacitors of the second cell string and then selecting the first word line and performing the read and rewrite operation continuously and together for all data stored in the ferroelectric capacitors of the first string when the second word line is selected at the time of reading data.

According to a fourth aspect of the present invention, there is provided a method for accessing a ferroelectric memory having a first bit line, a second bit line, a first word line, a second word line, a plurality of plate lines, a first cell string having a first node electrode, a first path transistor connected between the first bit line and the first node electrode and held in a conductive state or a nonconductive state according to a voltage supplied to the first word line, and a plurality of ferroelectric capacitors with one electrodes commonly connected to the first node electrode and the other electrodes connected to plate lines different from each other, and a second cell string having a second node electrode, a second path transistor connected between the second bit line and the second node electrode and held in the conductive state or the nonconductive state according to the voltage supplied to the second word line, and a plurality of ferroelectric capacitors with one electrodes commonly connected to the second node electrode and the other electrodes connected to plate lines different from each other and storing one bit in a pair of ferroelectric capacitors in the first and second cell strings sharing a plate line as electrodes, comprising a step of simultaneously selecting the first and second word lines and performing the read and the rewrite operation continuously and together for all data stored in the ferroelectric capacitor pairs of the first and second cell strings at the time of reading data.

According to the present invention, the memory device is structured as a simple matrix type array divided into fine units by path transistors, but in which not one, but a plurality of ferroelectrio capacitors are connected to each node electrode connected via the path transistor to the bit line.

Further, the data of a plurality of ferroelectric capacitors sharing a node or plate line is accessed together and continuously. Further, the accessed data is rewritten.

Further, according to the present invention, the ferroelectric capacitors in the nonselected cell string which are not selected by the path transistor and do not share the selected plate line are not disturbed.

Further, the ferroelectric capacitors in the cell string are continuously accessed together. For this reason, the rewriting is reliably carried out at that access, and the data deteriorating up until that access is refreshed and restored to the original state.

By this, no matter which ferroelectric capacitor is accessed by whatever format, the upper limit of the number of times individual ferroelectrio capacitors are disturbed can be made constant and very small.

Accordingly, by adequately setting the frequency of division, stable access without destruction of the data while maintaining the very small cell size can be guaranteed.

BRIEF DESCRIPTION OF THE DRAWINGS

The above object and features of the present invention will be more apparent from the following description of the preferred embodiments given with reference to the accompanying drawings, wherein:

FIGS. 5A and 5B are views of one cell string portion where the ferroelectric capacitor of the ferroelectric memory according to the present invention is configured as a stack type, in which FIG. 5A is a plan view of the layout, and FIG. 5B is a sectional view;

FIGS. 6A and 6B are views of the configuration of a one-transistor+one-capacitor type cell of the related art, in which FIG. 6A is a plan view of the layout, and FIG. 6B is a sectional view; and FIGS. 7A and 7B are views of an example of the configuration of one cell string portion where the ferroelectric capacitor of the ferroelectric memory according to the present invention is configured as a stack type, in which FIG. 7A is a plan view of the layout, and FIG. 7B is a sectional view.

DESCRIPTION OF THE PREFERRED EMBODIMENTS

Next, preferred embodiments of the present invention will be described with reference to the related figures.

Figure 4:
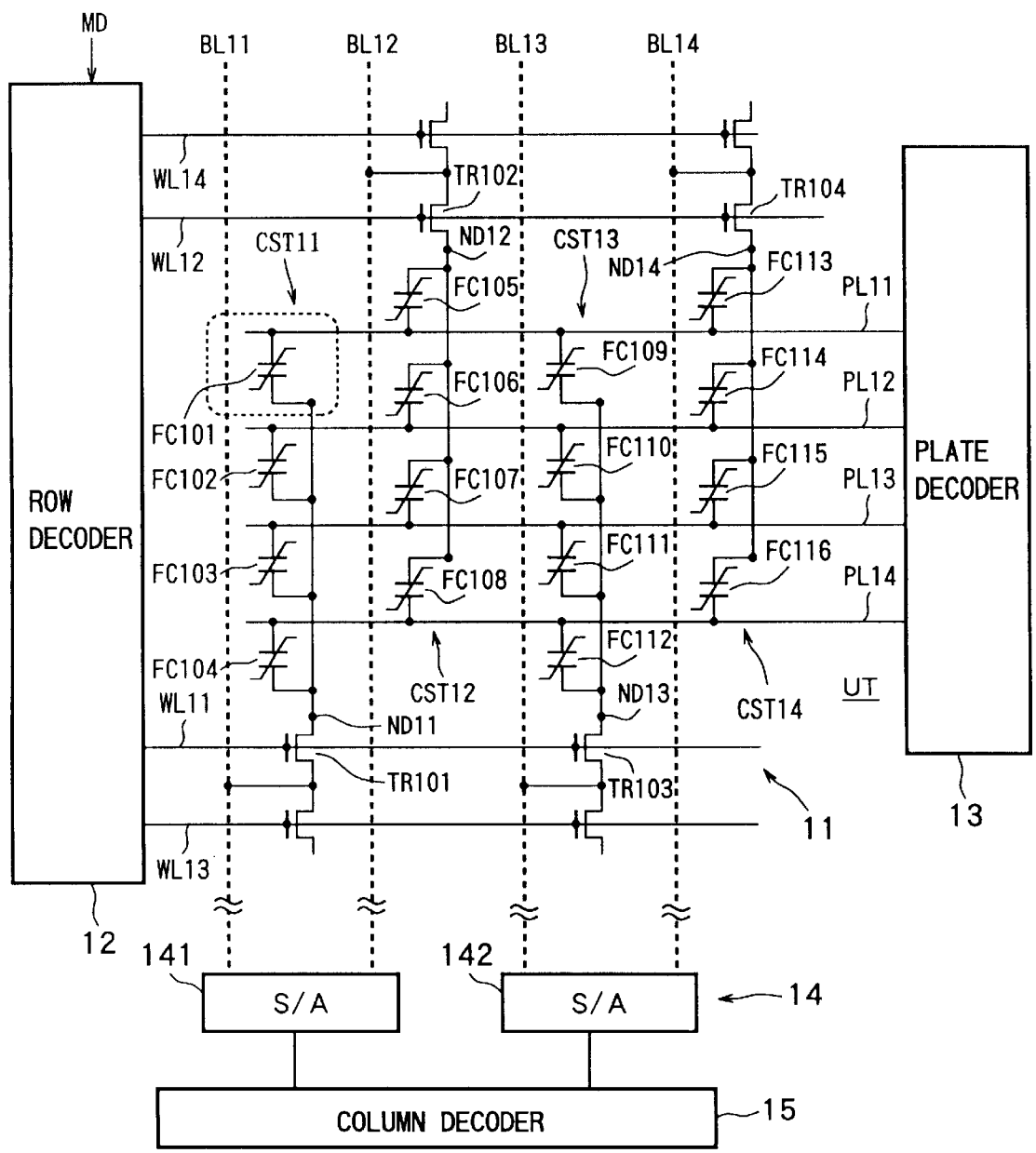
FIG. 4 is a circuit diagram of a ferroelectric memory according to an embodiment of the present invention.

FIG. 4 is a circuit diagram of a folded bit line type ferroelectric memory according to an embodiment of the present invention.

A ferroelectric memory 10 according to the present invention is configured so that it can operate in a first operation mode and a second operation mode as mentioned above and so that the operation mode is switched by an instruction to for example a not illustrated control system circuit.

This ferroelectric memory 10 is configured by, as shown in FIG. 4, a memory cell array 11, a row decoder 12, a plate decoder 13, a sense amplifier (S/A) group 14, and a column decoder 15.

In the memory cell array 11, a plurality of (16 in the present embodiment) ferroelectric capacitors FC101 to FC116 constituting memory cells are arranged in the form of a matrix. The 16 ferroelectric capacitors configuring the memory cells are separated as a cell unit UT.

Note that, in FIG. 4, only one cell unit is shown for simplification of the drawing, but the memory cell array 11 is configured by arranging a plurality of cell units in the form of a matrix.

A cell unit UT is divided into four cell strings CST11 to CST14.

The cell string CST11 is configured by a path transistor TR101 comprised of an n-channel MOS transistor and the ferroelectric capacitors FC101, FC102, FC103, and FC104 arranged in the identical column.

In the cell string CST11, one electrode each of the ferroelectric capacitors FC101, FC102, FC103, and FC104 of the plurality of (four in the present embodiment) memory cells are commonly connected to one node electrode ND11 connected via the path transistor TR101 to a bit line BL11.

The other electrodes of the ferroelectric capacitors FC101, FC102, FC103, and FC104 are connected to plate lines PL11, PL12, PL13, and PL14 different from each other and configured so that data can be independently written in each of the ferroelectric capacitors FC101, FC102, FC103, and FC104 of the memory cells.

Note that the data of the plurality of ferroelectric capacitors FC101, FC102, FC103, and FC104 sharing the node electrode ND11 is accessed together and continuously. Further, the accessed data is amplified at the sense amplifier and rewritten.

The cell string CST12 is configured by a path transistor TR102 comprising an n-channel MOS transistor and the ferroelectric capacitors FC105, FC106, FC107, and FC108 arranged in the identical column.

In the cell string CST12, one electrode each of the ferroelectric capacitors FC105, FC106, FC107, and FC108 of the memory cells are commonly connected to one node electrode ND12 connected via the path transistor TR102 to a bit line BL12.

The other electrodes of the ferroelectric capacitors FC105, FC106, FC107, and FC108 are connected to plate lines PL11, P112, PL13, and PL14 different from each other and configured so that the data can be independently written in each of the ferroelectric capacitors FC105, FC106, FC107, and FC108 of the memory cells.

Note that the data of the plurality of ferroelectric capacitors FC105, FC106, FC107, and FC108 sharing the node electrode ND12 is accessed together and continuously. Further, the accessed data is amplified at the sense amplifier and rewritten.

The cell string CST13 is configured by a path transistor TR103 comprising an n-channel MOS transistor and the ferroelectric capacitors FC109, FC110, FC111, and FC112 arranged in the identical column.

In the cell string CST13, one electrode each of the ferroelectric capacitors FC109, FC110, FC111, and FC112 of the memory cells are commonly connected to one node electrode ND13 connected via the path transistor TR103 to a bit line BL13.

The other electrodes of the ferroelectric capacitors FC109, FC110, FC111, and FC112 are connected to the plate lines PL11, P112, PL13, and PL14 different from each other and configured so that the data can be independently written at each of the ferroelectric capacitors FC109, FC110, FC111, and FC112 of the memory cells.

Note that the data of the plurality of ferroelectric capacitors FC109, FC110, FC111, and FC112 sharing the node electrode ND13 is accessed together and continuously. Further, the accessed data is amplified at the sense amplifier and rewritten.

The cell string CST14 is configured by a path transistor TR104 comprising an n-channel MOS transistor and the ferroeleotric capacitors FC113, FC114, FC115, and FC116 arranged in the identical column.

In the cell string CST14, one electrode each of the ferroelectric capacitors FC113, FC114, FC115, and FC116 of the memory cells are commonly connected to one node electrode ND14 connected via the path transistor TR104 to a bit line BL14.

The other electrodes of the ferroelectric capacitors C113, FC114, FC115, and FC116 are connected to the plate lines PL11 , P112, PL13, a nd PL134 different from each ther an d configured so that the data can be independently written to each of the ferroelectric capacitors FC113, FC114, FC115, and FC116 of the memory cells.

Note that the data of the plurality of ferroelectric capacitors FC113, FC114, FC115 and FC116 sharing the node electrode ND14 is accessed together and continuously. Further, the accessed data is amplified at the sense amplifier and rewritten.

Then, the gate electrodes of the path transistors TR101 and TR103 configuring the cell strings CST11 and CST13 are connected to a common first word line WL11, and the gate electrodes of the path transistors TR102 and TR104 configuring the cell strings CST12 and CST14 are connected to a common second word line WL12.

Figure 1:
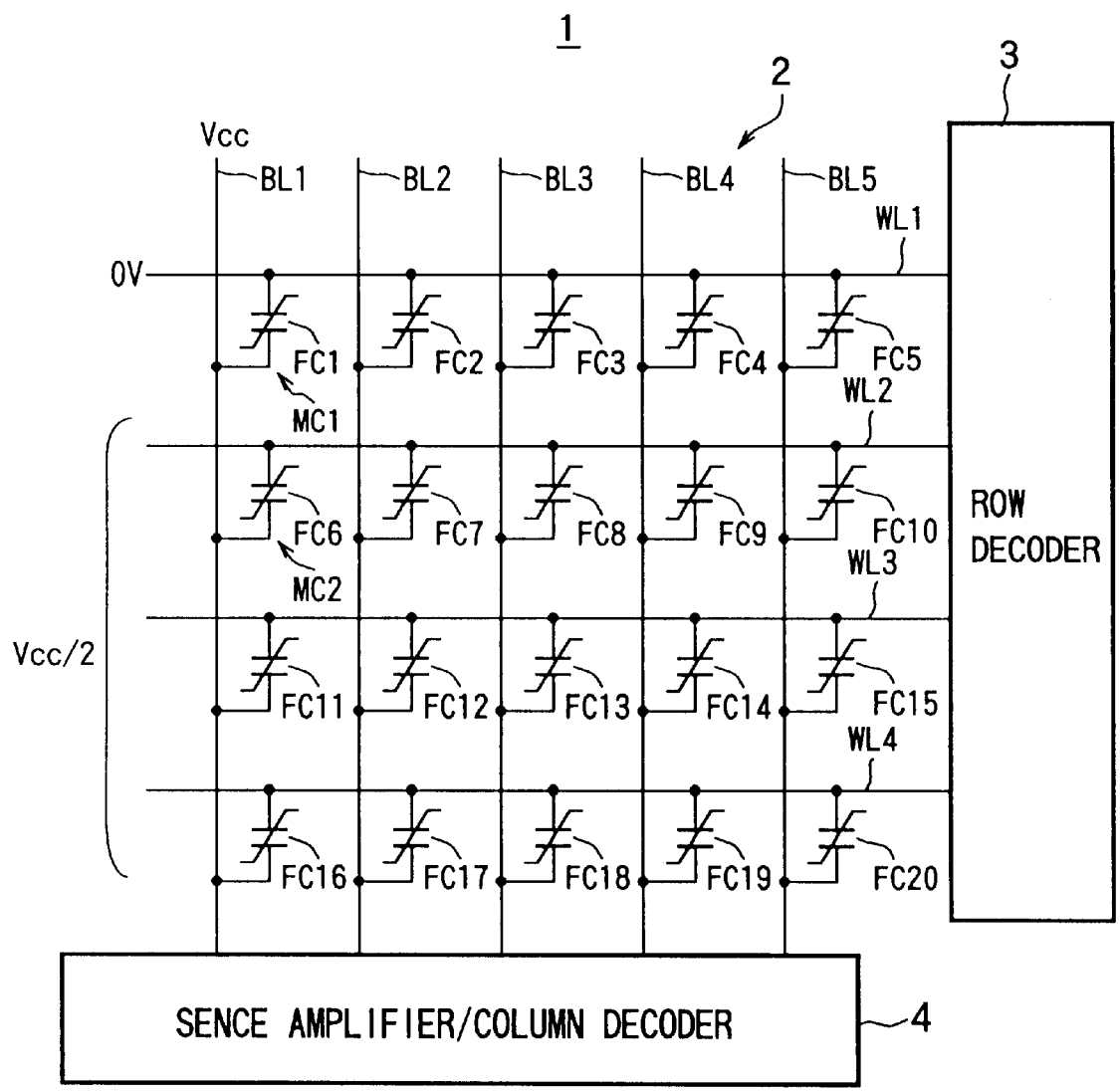
FIG. 1 is a circuit diagram of an example of the configuration of a simple matrix type ferroelectric memory.
Figure 2A:
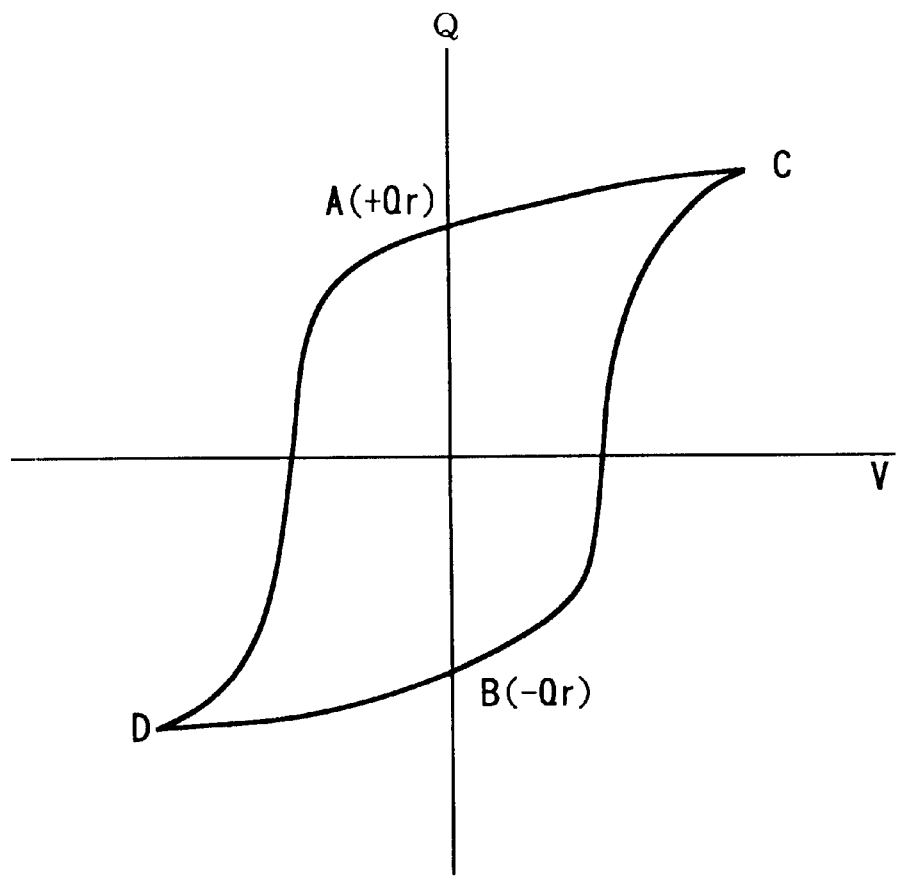
FIGS. 2A to 2C are views of the hysteresis characteristic of a ferroelectric capacitor and the states of capacitors in which data having inverse phases to each other are written.
Figure 2B:
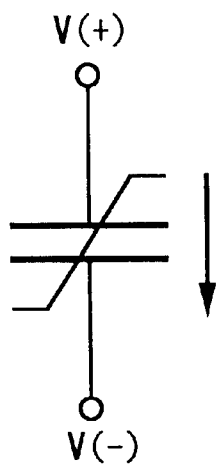
Figure 2C:
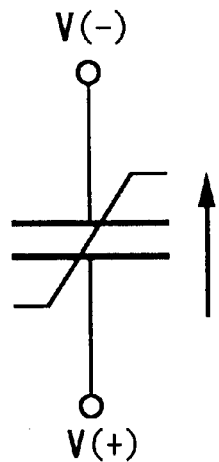
Figure 3:
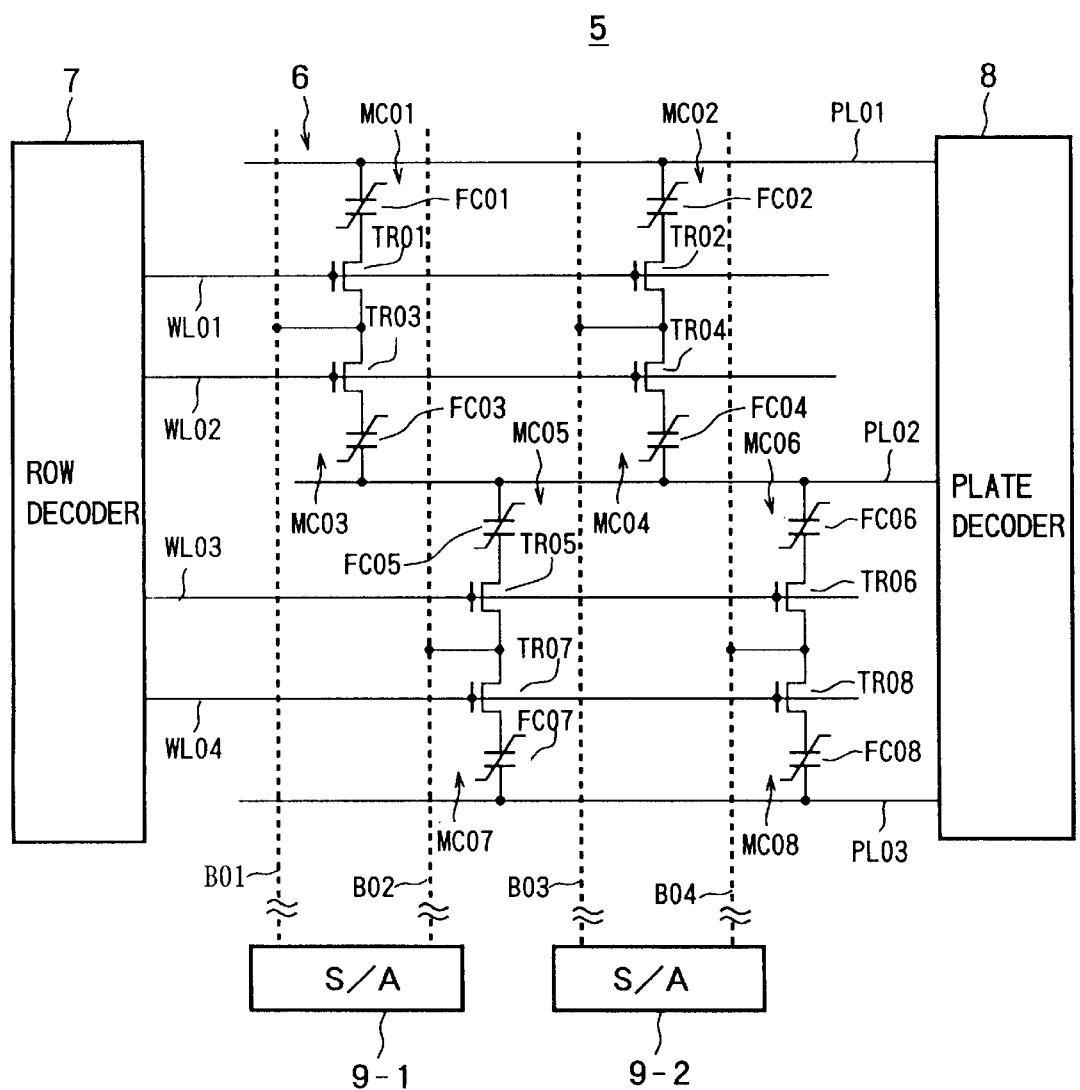
FIG. 3 is a circuit diagram of an example of the configuration of a folded bit line type ferroelectric memory having a one-transistor+one-capacitor type cell.

The row decoder 12 applies for example the power supply voltage $V_{cc}+\alpha$ ($\alpha$ is a voltage not less than the threshold voltage Vth of the path transistor, for example 1V) to the word line with the address which is designated, i.e., WL1 or WL12 in the example of FIG. 1, and makes it hold the path transistor in the conductive state in units of cell units.

Then, the row decoder 12 receives the mode signal MD of the not illustrated control system circuit, independently drives the first word line WL11 and the second word line WL12 at the time of the first operation mode, and simultaneously drives the first word line WL11 and the second word line WL12 at the time of the second operation mode.

The plate decoder 13 supplies a predetermined voltage 0V or $V_{cc}$ that can write or read and rewrite data with respect to the ferroelectric capacitor of the memory cell with the designated address to the plate lines PL11 to PL14 with the designated address and supplies the predetermined voltage $V_{cc}/2$ to the nonselected plate lines at the time of the data access.

Note that, as mentioned above, in the access of the memory cell array 11, the selection is carried out in units of cell units (in units of word lines) and the access is carried out together and continuously with respect to the plurality of (four in the present embodiment) ferroelectric capacitors connected to one node in the cell string, therefore the addresses of four plate lines PL11 to PL14 are continuously designated.

The sense amplifier group 14 has a sense amplifier 141 to which the bit lines BL11 and BL12 are connected and a sense amplifier 142 to which the bit lines BL13 and BL14 are connected.

The sense amplifiers 141 and 142 latch and amplify the data read to the bit lines BL11 to BL14 and perform the rewriting (refresh operation) at the time of the write or read operation.

The column decoder 15 selects the sense amplifiers 141 and 142, outputs the read data latched at the sense amplifier, supplies the write data to the corresponding sense amplifier, and so on according to the address designation.

Note that, as mentioned before, the ferroelectric memory 10 according to the present embodiment can operate in a first operation mode and a second operation mode, and the operation mode is switched by an instruction to for example the not illustrated control system circuit.

In the first operation mode, the first word line WL11 and the second word line WL12 are independently operated, and one bit is stored for one ferroelectric capacitor.

In the second operation mode, the first word line WL11 and the second word line WL12 are simultaneously operated, and one bit is stored by a pair of capacitors sharing a plate line as electrodes, that is, one of the ferroelectric capacitors of the first cell string CST11 (or CST13) and one of the capacitors of the second cell string CST12 (or CST14).

Note that when operating in the first operation mode, when the first word line WL11 is selected, the reference potential is given to the bit line BL12 (or BL14) by the not illustrated dummy cell, while when the second word line WL12 is selected, the reference potential is given to the bit line BL11 (or BL13) by the not illustrated dummy cell.

Next, an explanation will be made of the read and the write operation by the above configuration separated into the case of the first operation mode and the case of the second operation mode and focusing on a read operation.

Note that, here, the explanation will be made by taking as an example the case where the word line WL11 and the plate line PL11 are selected and the bit line BL11 is selected as the column, that is, the case where the ferroelectric capacitor FC101 of the cell string CST11 of the cell unit UT1 is accessed.

First, an explanation will be made of the read operation in the first operation mode.

Read Operation in First Operation Mode

In the initial state, the plate lines PL11 to PL14 and the bit line BL11 are fixed at $V_{cc}/2$.

In this state, $V_{cc}+\alpha$ is supplied to the word line WL11 selected by the row decoder 12 and the cell strings CST11 and CST13 are selected. By this, the path transistors TR101 and TR103 become the conductive state, the node electrode ND11 is connected to the bit line BL11, and the node electrode ND13 is connected to the bit line BL13.

Next, the potential of the selected plate line PL11 is switched from $V_{cc}/2$ to 0V, and at least the bit lines BL11 and BL12 are equalized to 0V, then brought to a floating state.

Next, the potential of the selected plate line PL11 is raised from 0V to the power supply voltage $V_{cc}$ level.

At this time, the potentials of the nonselected plate lines PL12 to PL14 are fixed at $V_{cc}/2$.

At this time, if the ferroelectric capacitor FC101 connected to the selected plate line PL11 has been polarized from the node electrode ND11 side to the plate line PL11 side (data "1"), the power supply voltage $V_{cc}$ will be supplied in a direction opposite to that of the original polarization. As a result, the polarization state of the ferroelectric capacitor FC101 inverts, and the inverted charge is released to the bit line BL11.

On the other hand, if the ferroelectric capacitor FC101 has been polarized from the plate line PL11 side to the node electrode ND11 side (data "0"), the voltage in the same direction as that of the polarization direction has been supplied, so the inversion current does not flow.

Accordingly, the potential rise of the bit line BL1 becomes large where the data "1" is stored in the ferroelectric capacitor FC101, while becomes small where the data "0". Is stored.

On the other hand, with respect to the bit line BL12 forming a pair with the bit line BL11, a potential rise intermediate between the potential rise in the case of the data "1" and the potential rise in the case of the data "0" is generated by a not illustrated dummy cell. In other words, a reference potential of a potential intermediate between the potential rise in the case of the data "1" and the potential rise in the case of the data "0" is given to the bit line BL12.

Here, the sense amplifier 141 is activated, the potential difference between the bit line BL11 and the bit line BL12 is detected, the read operation is carried out, and the signal is amplified.

By this, when the data "1" is stored in the ferroelectric capacitor FC101, the bit line BL11 is driven to $VC_{cc}$, and the bit line BL12 is driven to 0V.

On the other hand, when the data "0" is stored in the ferroelectric capacitor FC101, the bit line BL11 is driven to 0V, and the bit line BL12 is driven to $VC_{cc}$.

In the above read operation, when the data "1" is s tor ed in the ferroelectric capacitor FC101. the storage data is once destroyed, therefore the plate line PL11 is further switched from $V_{cc}$ to 0V. By this, when reading the data to the bit line BL11 th e polarization Inverted ferroelectric capacitor FC101 inverts in polarization again and the original data is rewritten.

Namely, by the driving of the bit lines BL11 and BL12 b y the sense amplifier 141 and the switching of the plate line PL11 from $V_{cc}$ to 0V, both of the data "1" and "0" are rewritten by the supply of the voltage $V_{cc}$ and the complete state before the reading the returned to.

As described above, by driving the selected plate line PL11, the data of the ferroelectric capacitor FC101 is read to the sense amplifier 141, amplified, and rewritten.

Then, only the data of the sense amplifier 141 of the selected column is sent to an I/O line and output.

In the above reading step, the potential of the node electrode ND11 fluctuates within 0V to $V_{cc}$.

Accordingly, $(\pm\frac{1}{2})V_{cc}$ is supplied also to the nonselected ferroelectrio capacitors FC102, FC103, and FC104 connected to the nonselected plate lines PL12 to PL14 fixed at $V_{cc}/2$.

Further, the ferroelectric capacitor FC105 connected to the nonselected node electrode ND12 is disturbed by the drive of the plate line PL11.

The amount of disturbance in this case is determined according to the potential fluctuation of the node ND12 in the floating state, but the ferroelectric capacitors FC106, FC107, and FC108 form parasitic capacitances with the plate lines PL12, PL13, and PL14 with the fixed potentials, therefore the amount of fluctuation becomes approximately $(\frac{1}{4})\times(\pm\frac{1}{2})V_{cc}=(\pm\frac{1}{8})V_{cc}$. Further, the potential difference between the node electrode ND12 and the plate line PL11 is $(\pm\frac{3}{8})V_{cc}$.

Accordingly, the ferroelectric capacitor FC105 receives the disturbance of $(\frac{3}{8})V_{cc}$, and the ferroelectric capacitors FC106, FC107, and FC108 receive the disturbance of $(\frac{1}{8})V_{cc}$.

Namely, all of the nonselected capacitors sharing a node electrode or plate line with the selected capacitor receive the disturbance of $(\frac{1}{8})V_{cc}$ to $(\frac{1}{2})V_{cc}$, and the data stored in each capacitor deteriorates little by little.

Therefore, the following operations are carried out after the reading of the selected ferroelectric capacitor FC101. Namely, the selected plate line PL11 is returned from the power supply voltage $V_{cc}$ to $V_{cc}/2$, the plate line PL12 is switched from $V_{cc}/2$ to 0V this time, and the bit lines BL11 and BL12 are equalized to 0V again and brought to the floating state.

Then, an operation similar to the read operation of the ferroelectrio capacitor FC101 mentioned above is carried out, that is, the potential of the plate line PL12 is raised from 0V to the power supply voltage $V_{cc}$ level. At this time, the potentials of the nonselected plate lines PL11, PL13, and PL14 are fixed at $V_{cc}/2$.

In this state, the charge according to the storage data is released to the bit lines BL11 and BL12, then the sense amplifier 141 is activated, the data of the ferroelectric capacitor FC102 is read to the sense amplifier, and the data is rewritten.

Below, an operation similar to that for the plate line PL12 is sequentially carried out also with respect to the plate lines PL13 and PL14, and the data is rewritten to all ferroelectric capacitors sharing the node electrode ND11.

After the above read and rewrite operation is carried out continuously and together for the ferroelectric capacitors FC101 to FC104 of the cell string CST11, the voltage supplied to the first word line WL11 is switched from the power supply voltage $V_{cc}+\alpha$ to 0V, and then the voltage supplied to the second word line L12 is switched from 0V to the power supply voltage $V_{cc}+\alpha$.

Namely, after reading and rewriting data with espect to the ferroelectric capacitors FC101 to FC104 of the cell string CST11 continuously and together, the read and rewrite operation is carried out for the four ferroelectric capacitors FC105 to FC108 sharing the node electrode ND12 of the cell string CST12.

For these ferroelectric capacitors FC105 to FC108, the read and rewrite operation is carried out in the same way as the case of the ferroelectric capacitors FC102 to FC104 mentioned above, so a detailed explanation is omitted here.

By this, all of the ferroelectric capacitors FC102 to FC103 and FC105 to FC108 disturbed by the reading of the ferroelectric capacitor FC10 are rewritten (refreshed) one time.

Similarly, when for example the ferroelectric capacitor FC106 located at about the middle of the opposite side bit line BL12 is selected, first the word line WL12 is selected, the path transistor TR102 is held in the conductive state, and the plate line PL12 is driven and the desired data is read out.

Then, the refresh operation of the ferroelectric capacitors FC107, FC108, and FC105 is carried out by sequentially driving the plate lines PL13, PL14, and PL11.

Subsequently, the word line WL12 is brought to the nonselected state (0V drive), the word line WL11 is selected, the path transistor TR102 is switched to the nonconductive state, and the path transistor TR101 is held in the conductive state.

Then, the plate lines PL12, PL13, PL14, and PL11 are sequentially driven, and the refresh operation of the ferroelectric capacitors FC102, FC103, FC104, and FC101 is carried out.

Note that these controls can be easily realized by, first, determining from the row address of the selected bit the selected word line and the plate line to be driven first and further generating addresses of the plate lines to be sequentially driven by using a 2-bit counter.

When reading data by the steps as described above, although the nonselected ferroelectric capacitors sharing the node electrode or the plate line are disturbed, the data is reliably rewritten (refreshed) one time in the same access step, so the data deterioration is recovered from every time disturbance occurs.

Accordingly, the degree of the data deterioration is limited to the number of times of disturbance from one refresh to the next refresh.

Write ODeration in First Operation Mode

For example, when writing data to the ferroelectric capacitor FC101, the first word line WL11 and the plate line PL11 perform the drive in the same way as that of the case of the read operation mentioned above, while the bit lines BL11 and BL12 are forcibly driven so as to store the desired data via the sense amplifier 141.

In this case as well, the nonselected cells sharing the node electrode and the plate line receive a similar disturbance, therefore, in the same way as the case of reading, they may be sequentially continuously accessed and the data rewritten.

Note that when writing data in units of the ferroelectric capacitors, the sense amplifier is not forcibly driven for the nonselected ferroelectric capacitors and only the read and rewrite operation is carried out.

Specifically, the power supply voltage $V_{cc}+\alpha$ is supplied to the word line WL11 designated in address and selected from the control system by the row decoder 12. By this, the cell string CST11 is selected, and the path transistor TRi01 is held in the conductive state.

On the other hand, the potential of the nonselected word line WL12 is held at 0V, and the path transistor TR102 of the cell string CST12 is held in the nonconductive state.

In this state, 0V is supplied to the plate line PL11 designated in address and selected from the control system by the plate decoder 13 in place of the $V_{cc}/2$ supplied to the nonselected plate lines-and then the power supply voltage $V_{cc}$ is supplied.

Further, $V_{cc}/2$ is supplied by the plate decoder 13 to the nonselected plate lines PL12 to PL14.

At this time, the selected bit line BL11 is equalized to 0V through the column decoder 15 and then brought to the floating state.

By this, a charge according to the stored data is released to the bit line BL11 from the ferroelectrio capacitor FC101 via the path transistor TR101.

At this time, a larger charge than from the ferroelectric capacitor in which the data "0" is written is released from the ferroelectrio capacitor in which the data "1" is written.

The data based on this amount of charge is sensed (read) by the sense amplifier 141 via the bit line BL11 and amplified.

The read data is latched at the sense amplifier 141.

At this time, the desired data is written in only the sense amplifier 141 of the selected column and the state of the sense amplifier 141 is inverted according to need.

Here, when for example the data "0" is written as the desired data in the sense amplifier 141, the bit line BL11 is driven to 0V by the sense amplifier 141. At this time, the potential of the plate line PL11 is held at the power supply voltage $V_{cc}$ level.

Accordingly, the selected ferroelectric capacitor FC101 of the cell string CST11 becomes the polarization state from the other electrode (plate line) side to one electrode (node electrode) side, and the data "0" is written in the ferroelectric capacitor FC101.

Then, even if the potential of the selected plate line PL11 is switched to 0V, the polarization does not invert and the stored state of the data "0" is held.

On the other hand, when the data "1" is written in the sense amplifier 141 as the desired data, the bit line BL11 is driven to $V_{cc}$ by the sense amplifier 141. At this time, the potential of the plate line PL11 is held at the power supply voltage $V_{cc}$ level. Accordingly, data is not written out in this case.

Then, the potential of the selected plate line PL11 is switched to 0V.

By this, the polarization state from one electrode (node electrode) side to the other electrode (plate line) side is exhibited, and the data "1" is written in the ferroelectric capacitor F101.

After the write operation using the plate line PL11 connected to the ferroelectric capacitor FC101 sele cted as described above, the selected plate line PL11 is return ed from the power supply voltage $V_{cc}$ to $V_{cc}/2$, the plate line PL12 is switched from $V_{cc}/2$ to 0V, and the bit lines BL111 and BL12 are equalized to 0V again and brought to the floating state.

Then, an operation simila r t o the read operation of the ferroelectric capacitor FC101 mentioned above is carried out, that is, the p otential of the plate line PL12 is raised from 0V to the power supp ly voltage $V_{cc}$ level. At this time, the potentials of the nonselected plate lines PL11, PL13, and PL14 are fixed at $V_{cc}/2$.

In this state, charges according to the stored data are released to the bit lines BL11 and BL12, the sense amplifier 141 is activated, and the data of the ferroelectric capacitor FC102 is read to the sense amplifier and rewritten.

Below, an operation similar to that for the plate line PL12 is sequentially carried out for the plate lines PL13 and PL14, so data is rewritten for all ferroelectric capacitors sharing the node electrode ND11.

After performing the read and rewrite operation with respect to the ferroelectric capacitors FC101 to FC104 of the cell string CST11 continuously and together, the voltage supplied to the first word line WL11 is switched from the power supply voltage $V_{cc}+\alpha$ to 0V and the voltage supplied to the second word line WL12 is switched from 0V to the power supply voltage $V_{cc}+\alpha$.

Namely, after performing the read and rewrite operation on the ferroelectric capacitors FC101 to FC104 of the cell string CST11 continuously and together, the read and rewrite operation is carried out for the four ferroeleotric capacitors FC105 to FC108 sharing the node electrode ND12 of the cell string CST12.

The read and rewrite operation is carried out for these ferroelectric capacitors FC105 to FC108 in the same way as the case of the ferroelectric capacitors FC102 to FC104 mentioned above.

By this, all of the ferroelectrio capacitors FC102 to FC103 and FC105 to FC10B disturbed by the read operation of the ferroelectric capacitor FC101 have been rewritten (refreshed) one time.

Next, an explanation will be made of the read operation in the second operation mode.

In this second operation mode, 1 bit is complementarily stored by using two ferroelectric capacitors.

In the case of the configuration of FIG. 1, for example, data is stored bit by bit complementarily by the polarization direction in the pairs of the ferroelectric capacitors FC101 and FC105, FC102 and FC106, FC103 and FC107, FC104 and FC108, and FC109 and FC113, FC110 and FC114, FC111 and FC115, and FC112 and FC116.

Read Operation in Second Operation Mode

Note that, here, assume that the ferroelectric capacitor FC101 polarizes in the direction from the node electrode ND11 side to the plate line PL11 side, the ferroeleotric capacitor FC105 polarizes in the direction from the plate line PL11 side to the node electrode ND12 side, and the data is stored by their complementary information.

In the initial state, the plate lines PL11 to PL14 and the bit lines BL11 to BL14 are fixed at $V_{cc}/2$.

Here, the word line WL11 and the word line WL12 are simultaneously selected and the power supply voltage $V_{cc}+\alpha$ is supplied. By this, the path transistors TR101 and TR102 of the cell strings CST11 and CST12 are held in the conductive state, and the node electrodes ND11 and ND12 are connected to the bit lines BL11 and BL12. Note that, in this case, actually also the path transistors TR103 and TR104 of the cell strings CST13 and CST14 are held in the conductive state and also the node electrodes ND13 and ND14 are connected to the bit lines BL13 and BL14, but, below, an explanation will be made by paying attention to only the cell strings CST11 and CST12.

Next, the potential of the selected plate line PL11 is switched from $V_{cc}/2$ to 0V, a nd at least the bit lines BL11 and BL12 are equalized to 0V and then brought to the floating state.

Next, the p otential of the s elected plate line PL11 is raised from 0V to the power supply voltage $V_{cc}$ level by the plate decod er 13. At this time, the potentials of the nonselected plate lines PL12 to PL14 are fixed at $V_{cc}/2$.

By this, the power supply voltage $V_{cc}$ is supplied to the ferroelectric capacitor FC101 in the direction opposite to that of the original polarization, Its polarization state inverts, and the inverted charge is released.

On the other hand, the voltage in the same direction as the polarization direction is supplied to the ferroelectric capacitor FC105, so the polarization does not invert.

Accordingly, the potential of the bit line BL11 becomes slightly higher than the potential of the bit line BL12 by exactly the amount of the inverted charge.

Here, the sense amplifier 141 is activated, the potential difference between the bit lines BL11 and BL12 is amplified and read out and, the bit line BL11 is driven to $V_{cc}$, and the bit line BL12 is driven to 0V.

Further, the potential of the plate line PL11 is switched from the power supply voltage $V_{cc}$ to 0V. By this, the polarization inverted ferroelectric capacitor is polarized again, and the original data is rewritten.

In the present second operation mode as well, due to the potential fluctuation of the common node electrodes ND11 and ND12 in the reading step, $(\pm\frac{1}{2})V_{cc}$ is supplied to the nonselected ferroelectric capacitors FC102 to FC104 and FC106 to FC108 connected to the nonselected plate lines PL12 to PL14 fixed in potential to $(\frac{1}{2})V_{cc}$.

Therefore, when the read operation of the selected ferroelectric capacitors FC101 and FC105 forming a pair is terminated, the potential of the selected plate line PL11 is returned to $V_{cc}/2$, the potential of the plate line PL12 is switched from $V_{cc}/2$ to 0V this time, and the bit lines BL11 and BL12 are equalized to 0V again and brought to the floating state.

Then, an operation similar to the read operation of the ferroelectric capacitor FC101 mentioned above is carried out, that is, the potential of the plate line PL12 is raised from 0V to the power supply voltage $V_{cc}$ level. At this time, the potentials of the nonselected plate lines PL11, PL13, and PL14 are fixed at $V_{cc}/2$.

The data of the ferroelectric capacitors FC102 and FC106 forming a pair is read to the sense amplifier 141 this time and rewritten.

Below, an operation similar to that for the plate line PL12 is sequentially carried out for the plate lines PL13 and PL14, and the data is rewritten for all ferroelectric capacitors sharing the node electrodes ND11 and ND12.

In this way, in the present second operation mode as well, the nonselected ferroelectric capacitors sharing the node electrode are disturbed, but the data is reliably rewritten one time in the same access step, so the data deterioration is recovered from each time.

Accordingly, the degree of the data deterioration is limited to the number of times of disturbance from one rewriting to the next rewriting. In the case of the present embodiment, the upper limit of the disturbance is six times.

As explained above, according to the present embodiment, the memory cell array 11 is divided into a plurality of cell units UT and each cell unit is divided into the four cell strings CST11 to CST14. In the cell strings CST11 to CST14, one electrode each of the plurality of ferroelectric capacitors are connected to the nodes ND11 to ND14 connected to the bit lines via the path transistors, and, the other electrodes are connected to the plate lines PL11 to PL14 different from each other to make them able to independently access the plurality of ferroelectric capacitors in the cell strings. When accessing a ferroelectrio capacitor of the desired memory cell of the cell string, it is selected by the cell string, the selected ferroelectric capacitor is accessed (written or read) and, the ferroelectric capacitor of the cell string connected to the selected plate line identical to that for the selected ferroelectric capacitor is accessed and rewritten. Further, the ferroelectric capacitors connected to the nonselected plate lines are accessed and rewritten. Therefore, the number of times of disturbance can be limited to within a constant range no matter which order the read and write operations is performed in while suppressing the area overhead to a minimum. Accordingly, there is the advantage that access having a high reliability becomes possible without accompanying data loss.

Further, the present embodiment was configured so that the first operation mode for storing the data in one ferroelectric capacitor and the second operation mode for storing the data in two ferroelectric capacitors were provided on the identical chip, but the configuration is not limited to this. Needless to say the present invention can employ a configuration operating only in the first operation mode for storing one bit by one ferroelectric capacitor or the configuration operating only in the second operation mode for storing one bit by two ferroelectric capacitors.

Note that a large storage capacity can be obtained in the first operation mode, but a reference potential becomes necessary, the operation margin is small, and it is hard to obtain a high manufacturing yield. On the other hand, in the second operation mode, a high manufacturing yield is easily obtained, but the storage capacity is small.

Accordingly, by providing both of these, flexibility can be obtained in the test process and in product shipment.

For example, first, there is the advantage that it also becomes possible to test the product in the second operation mode, test the passed product in the first operation mode again, and therefore select the product in two ways.

Further, the present embodiment was configured so that one electrode each of the plurality of ferroelectric capacitors were connected to the nodes ND11 to ND14 connected to the bit lines via the path transistors, but by further configuring this ferroelectric capacitor as the stack type, the ferroelectric capacitor can be formed also on the path transistor and a cell area almost the same as that of the simple matrix type can be realized.

Below, an explanation will be made of this advantage with reference to FIGS. 5A and 5B and FIGS. 6A and 6B.

Figure 5A:
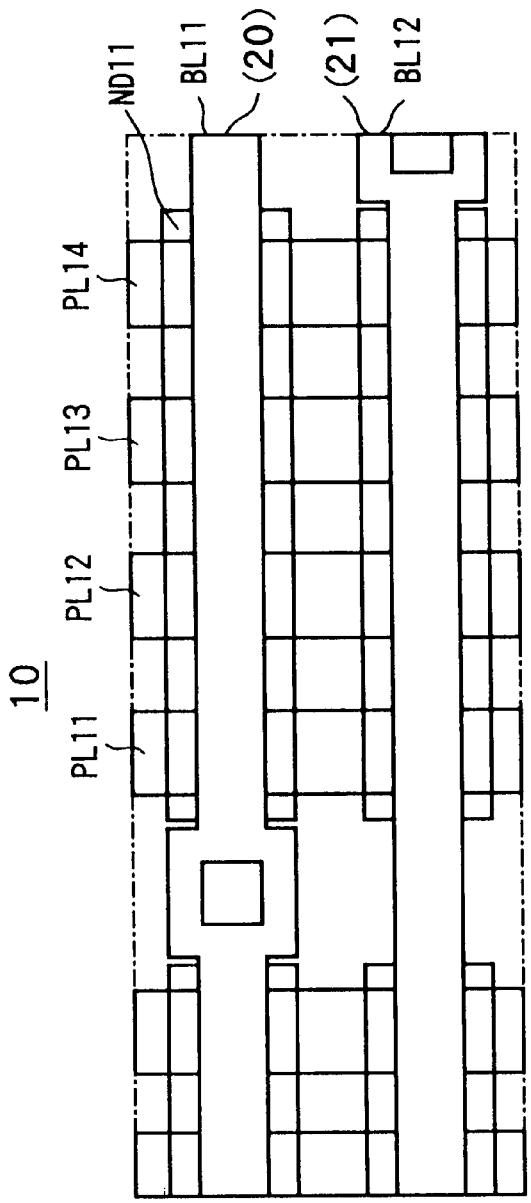
Figure 5B:
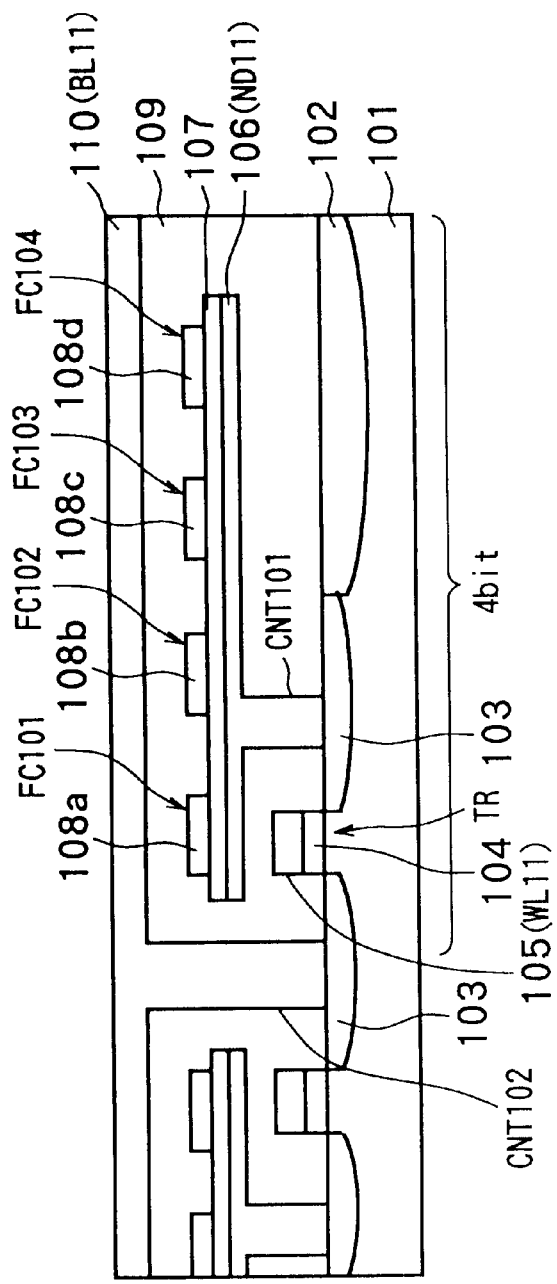

FIGS. 5A and 5B are views of one cell string portion where the ferroelectric capacitor of the ferroelectric memory according to the present invention is configured as a stack type, in which FIG. 5A is a plan view showing the layout, and FIG. 5B is a sectional view. Note that, In FIGS. 5A and 5B, hatching is omitted.

Further, here, the explanation will be made by taking as an example the cell string CST11.

In FIGS. 5A and 5B, 101 denote s a semiconductor substrate, 102 an element isolation region, 103 a drain and source region, 104 a gate oxide film, 105 a gate electrode (word line) made of polycrystalline silicon or polycide, 106 a common lower electrode of four ferroelectric capacitors configuring the node electrode ND11, 107 a ferroelectric capacitor insulator, 108a, 108b, 108c, and 108d upper electrodes configuring the plate lines PL11, PL12, PL13, and PL14, 109 an inter-layer insulating film, and 110 an aluminum interconnection layer configuring the bit line BL11.

As shown in FIGS. 5A and 5B, the ferroelectric capacitor 10 has one electrode each of the ferroelectric capacitors FC101 to FC104 connected to the common node electrode ND11 as the lower electrode 106, the ferroelectric capacitor insulator 107 is formed on this lower electrode 106, the upper electrodes 108a, 108b, 108c, and 108d are formed on the ferroelectric capacitor insulator 107 at predetermined intervals, and therefore the stack type ferroelectric capacitor is configured. Then, the ferroelectric capacitor is formed at the upper layer of the path transistor.

The lower electrode 106 is connected to the drain and source region 103 by the contact CNT101 and further connected to the aluminum interconnection layer 110 as the bit line BL11 via the region of the transistor TR and further via the contact CNT102.

Note that, the ferroelectric capacitor insulator 107 is made of a ferroelectric material having a hysteresis characteristic, for example $PbZrTiO_3$, $BiSr_2$, or $Ta_2O_9$.

By configuring the ferroelectric capacitor as a stack type as in this example, the capacitor can be formed also on the transistor TR, and a cell area almost the same as that of the simple matrix type can be realized.

Figure 6A:
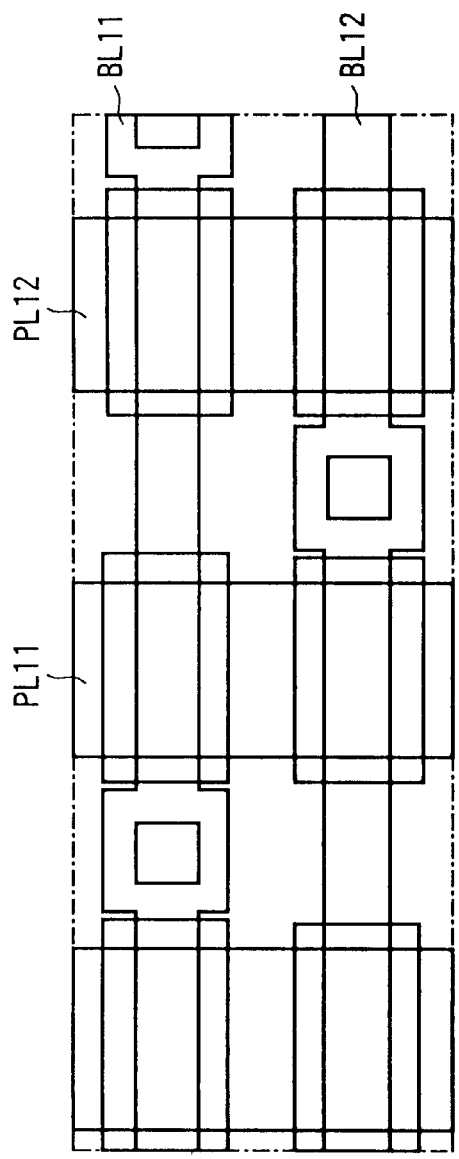
Figure 6B:
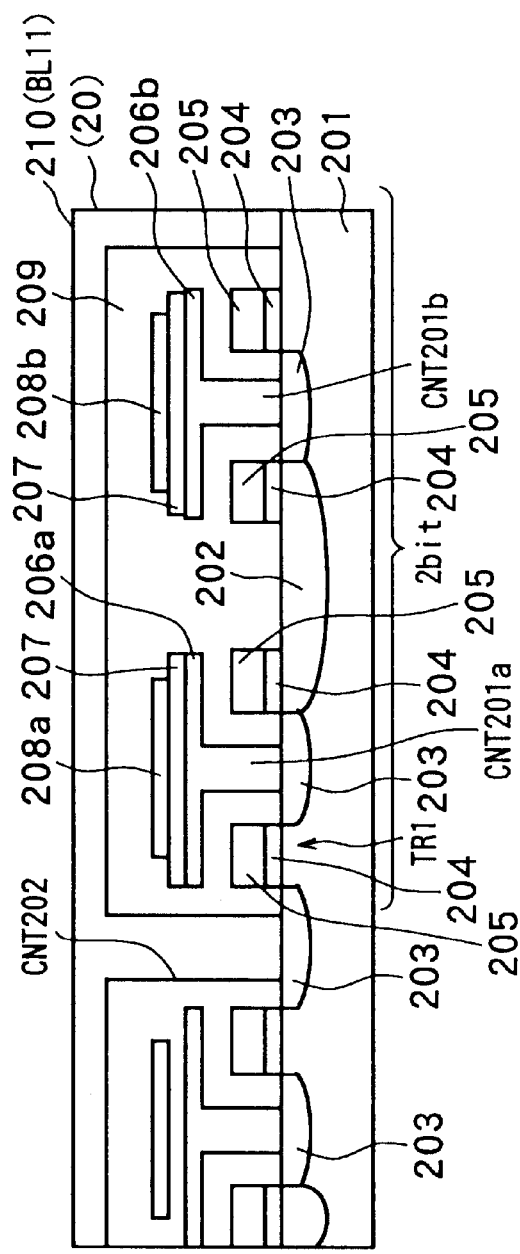

On the other hand, FIGS. 6A and 6B are views of the structure of a conventional one-transistor+one-capacitor type cell, in which FIG. 6A is a plan view showing the layout, and FIG. 6B is a sectional view. Note that, in FIG. 6A and 6B as well, the hatching is omitted.

In FIGS. 6A and 6B, 201 denotes a semiconductor substrate, 202 an element isolation region, 203 a drain and source region, 204 a gate oxide film, 205 a gate electrode (word line) made of polycrystalline silicon or polycide, 206a and 206b the lower electrodes of the ferroelectric capacitors configuring the node electrode, 207 a ferroelectric capacitor insulator, 208a and 208b the upper electrodes configuring the plate lines PL11 and PL12, 209 an inter-layer insulating film, and 210 an aluminum interconnection layer configuring the bit line BL11.

As shown in FIGS. 6A and 6B, in the structure of the related art, the node electrode is not shared, therefore it is necessary to secure one bit line contact region CNT202 and element isolation region 202 per 2 bits and the transistor region TR and node contact regions CNT201a and CNT201b for every bit on the substrate.

As apparent from the comparison of FIGS. 5A and 5B and FIGS. 6A and 6B, if the configuration of the present invention is used, the occupied area per bit can be greatly reduced to about a half of that of the related art. In addition, a sufficient margin for alignment of the bit line contact or the node contact with the gate electrode can be taken and the margin can be easily secured in the manufacturing process.

Figure 7A:
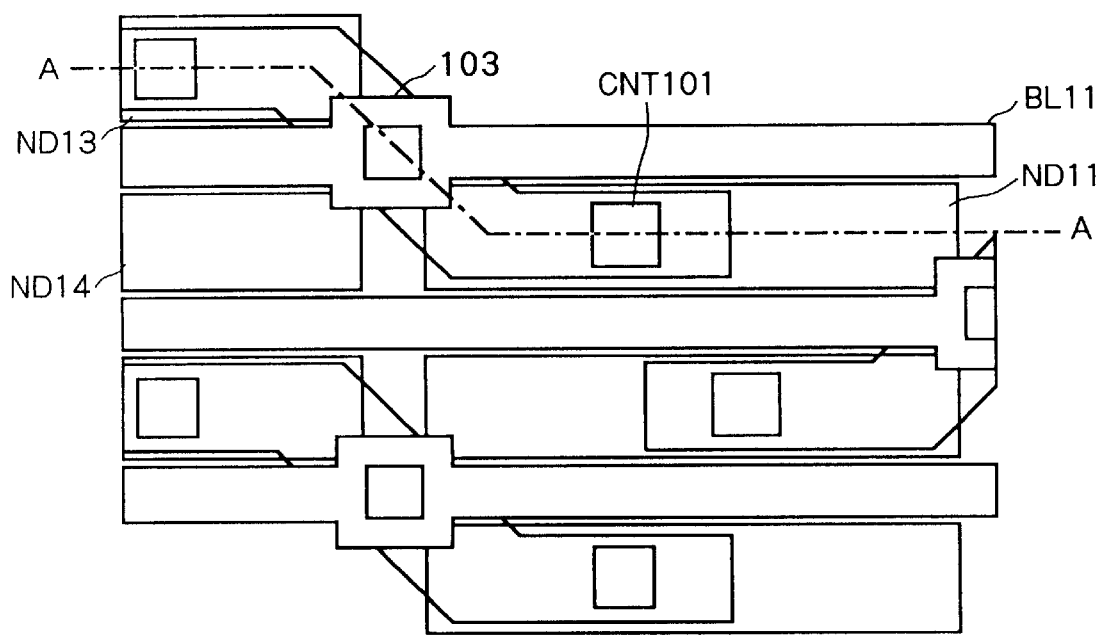
Figure 7B:
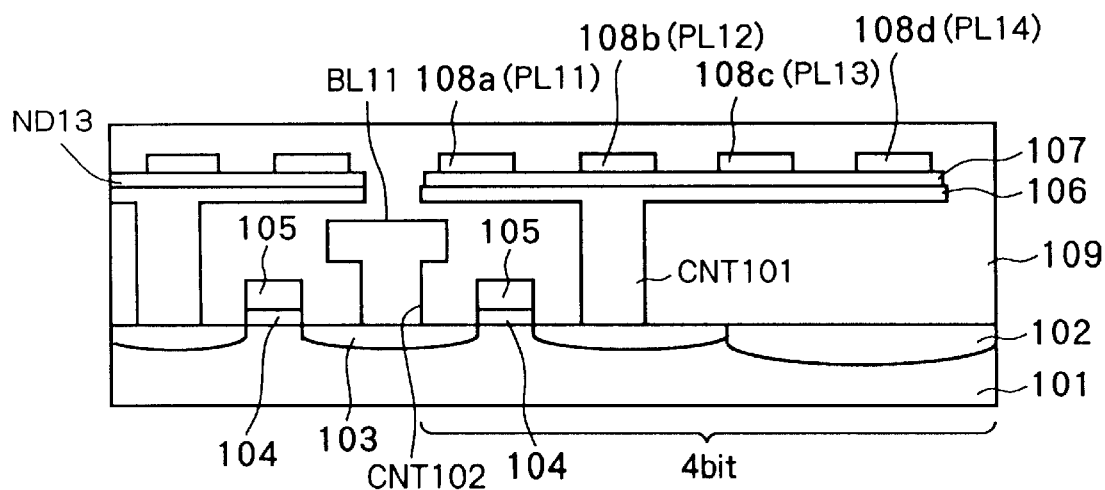

Further, FIGS. 7A and 7B are views of an example of another configuration of the one cell string portion where the ferroelectric capacitor of the ferroelectric memory according to the present invention is configured as a stack type, in which FIG. 7A is a plan view showing the layout, and FIG. 7B is a sectional view. Note that, in FIGS. 7A and 7B as well, the hatching is omitted.

In this example, by making the diffusion layer 103 slanted and taking the contact of the common node ND11 and the diffusion layer 103 from the side of the bit line BL11, the ferroelectric capacitors are formed at an upper layer of the bit line.

By this, the distance between nodes (ND11, ND13, or ND14) adjoining in the bit line direction can be reduced, and the memory cell area can be further reduced.

In the embodiment explained above, the case where four ferroelectric capacitors were connected to the identical node was mentioned, but any number of ferroelectric capacitors can be connected so far as the number of the ferroelectric capacitors is two or more.

In general, the larger the number of the ferroelectric capacitors connected to the identical node, the higher the storage density, but the larger the number of times of disturbance, so the data becomes easy to deteriorate.

Further, the bit line potential slightly fluctuates at the time of reading data, therefore when the number of capacitors connected to the identical node is large, a charge of the amount of fluctuation is released therefrom and become noise.

Accordingly, the number of capacitors connected to the identical node is desirably not more than 8, that is, within a range of from 2 to 8.

Summarizing the effect of the invention, as explained above, according to the present invention, there is the advantage that stable access without destruction of data can be guaranteed by effectively limiting the number of times of disturbance and defining the upper limit thereof to a small number while suppressing the area overhead to a minimum.

Further, according to the present invention, there are the advantages that a storage density comparable to a DRAM can be realized by a complementary type 2 capacitors/bit storage method having a stable characteristic and a storage density two times the storage density of a DRAM can be realized by the 1 capacitor/bit storage method. Consequently, a ferroelectric memory having a large capacity and high reliability can be realized at a low cost.

While the invention has been described by reference to specific embodiments chosen for purposes of illustration, it should be apparent that numerous modifications could be made thereto by those skilled in the art without departing from the basic concept and scope of the invention.

What is claimed is:

1. A ferroelectric memory, comprising:

a first bit line, a second bit line, a first word line, a second word line, a plurality of plate lines, a first cell string having a first node electrode, a first path transistor connected between said first bit line and said first node electrode and held in a conductive state or a nonconductive state according to a voltage supplied to said first word line, and a plurality of ferroelectric capacitors with one electrodes commonly connected to said first node electrode and the other electrodes connected to plate lines different from each other, a second cell string having a second node electrode, a second path transistor connected between said second bit line and said second node electrode and held in the conductive state or the nonconductive state according to the voltage supplied to said second word line, and a plurality of ferroelectric capacitors with one electrodes commonly connected to said second node electrode and the other electrodes connected to plate lines different from each other, and a means for simultaneously selecting said first word line and second word line, making them hold said first path transistor and second path transistor in a conductive state in parallel, and storing one bit in a pair of ferroelectric capacitors in said first and second cell strings sharing a plate line as electrodes.

2. A ferroelectric memory as set forth in claim 1, further comprising a means for performing the read and the rewrite operation continuously and together for all data stored in the ferroelectric capacitor pairs of said first and second cell strings when said first and second word lines are selected at the time of reading data.

3. A ferroelectric memory as set forth in claim 1, wherein each ferroelectric capacitor is formed in an upper layer of the bit line.

4. A ferroelectric memory, capable of operating in a first operation mode and a second operation mode, comprising:

a first bit line, a second bit line, a first word line, a second word line, a plurality of plate lines, a first cell string having a first node electrode, a first path transistor connected between said first bit line and said first node electrode and held in a conductive state or a nonconductive state according to a voltage supplied to said first word line, and a plurality of ferroelectrio capacitors with one electrodes commonly connected to said first node electrode and the other electrodes connected to plate lines different from each other, a second cell string having a second node electrode, a second path transistor connected between said second bit line and said second node electrode and held in the conductive state or the nonconductive state according to the voltage supplied to said second word line, and a plurality of ferroelectric capacitors with one electrodes commonly connected to said second node electrode and the other electrodes connected to plate lines different from each other, and a mode means for independently selecting said first word line and second word line in said first operation mode, making them hold said first path transistor and second path transistor independently in the conductive state or the nonconductive state, independently accessing each of the plurality of ferroelectric capacitors of the cell string where the path transistor is in the conductive state to store one bit in one ferroelectric capacitor, while simultaneously selecting said first word line and second word line in said second operation mode, making them hold said first path transistor and second path transistor in the conductive state in parallel, and storing one bit in a pair of ferroelectric capacitors in said first and second cell strings having each plate line as the electrode.

5. A ferroelectric memory as set forth in claim 4, wherein, in said first operation mode, said mode means gives a reference potential to said second bit line when said first word line is selected and gives the reference potential to said first bit line when said second word line is selected.

6. A ferroelectric memory as set forth in claim 4, further comprising a means:

for performing a read and rewrite operation continuously and together for all data stored in the ferroelectric capacitors of the first cell string and then selecting said second word line and performing the read and the rewrite operation continuously and together for all data stored in the ferroelectric capacitors of the second cell string when said first word line is selected at the time of reading data and for performing a read and rewrite operation continuously and together for all data stored in the ferroelectric capacitors of the second cell string and then selecting said first word line and performing the read and the rewrite operation continuously and together for all data stored in the ferroelectric capacitors of the first string when said second word line is selected at the time of reading data.

7. A ferroelectric memory as set forth in claim 4, wherein said mode means comprising a means for performing a read and rewrite operation continuously and together for all data stored in the ferroelectric capacitors of the first and second cell strings when said first and second word lines are selected at the time of reading data at the time of the second operation mode.

8. A method for accessing a ferroelectric memory having a first bit line, a second bit line, a first word line, a second word line, a plurality of plate lines, a first cell string having a first node electrode, a first path transistor connected between said first bit line and said first node electrode and held in a conductive state or a nonconductive state according to a voltage supplied to said first word line, and a plurality of ferroelectric capacitors with one electrodes commonly connected to said first node electrode and the other electrodes connected to plate lines different from each other, and a second cell string having a second node electrode, a second path transistor connected between said second bit line and said second node electrode and held in the conductive state or the nonconductive state according to the voltage supplied to said second word line, and a plurality of ferroelectric capacitors with one electrodes commonly connected to said second node electrode and the other electrodes connected to plate lines different from each other and storing one bit in a pair of ferroelectric capacitors in said first and second cell strings sharing a plate line as electrodes, comprising a step of:

simultaneously selecting said first and second word lines and performing the read and the rewrite operation continuously and together for all data stored in the ferroelectric capacitor pairs of said first and second cell strings at the time of reading data.

* * * * *